United States Patent [19]
Pasternak

[11] Patent Number: 5,912,560
[45] Date of Patent: Jun. 15, 1999

[54] CHARGE PUMP CIRCUIT FOR VOLTAGE BOOSTING IN INTEGRATED SEMICONDUCTOR CIRCUITS

[75] Inventor: John H. Pasternak, Campbell, Calif.

[73] Assignee: Waferscale Integration Inc., Fremont, Calif.

[21] Appl. No.: 08/806,560

[22] Filed: Feb. 25, 1997

[51] Int. Cl.[6] ...................................................... H03K 3/01
[52] U.S. Cl. .............................. 324/536; 363/60; 307/110
[58] Field of Search ..................................... 327/530, 534, 327/535, 536; 363/59, 60; 307/110

[56] References Cited

U.S. PATENT DOCUMENTS 5,675,279  10/1997  Fujimoto et al. ....................... 327/536

*Primary Examiner*—Kenneth B. Wells
*Attorney, Agent, or Firm*—Skjerven, Morrill, MacPherson, Franklin & Friel LLP

[57] ABSTRACT

A charge pump whose charge transfer switches are formed of charge transfer transistors and single pole, double throw (SPDT) switches each of which controls the gate of its corresponding transistor. Each SPDT switch has two throw contacts, one which is connected to the left diffusion of its corresponding charge transfer transistor and the other of which is connected to ground. Thus, the SPDT switch selectively connects the gate of the charge transfer transistor it controls between a diode connection (the first contact) and ground (the second contact). As a result, the charge transfer switches of the present invention are both fully on (when diode-connected) or fully off (when connected to ground).

11 Claims, 8 Drawing Sheets

CHARGE PUMP CIRCUIT FOR VOLTAGE BOOSTING IN INTEGRATED SEMICONDUCTOR CIRCUITS

FIELD OF THE INVENTION

The present invention relates to charge pumps generally.

BACKGROUND OF THE INVENTION

Charge pumps are used in microelectronics for generating one voltage level from another. Common applications include the boosting or attenuating of a given voltage to some new value.

An ideal charge pump is illustrated in FIGS. 1A and 1B to which reference is now made. Reference is also made to FIG. 2 which is a timing diagram of the control signals for the charge pump of FIGS. 1A and 1B.

The ideal charge pump includes an initial charge transfer switch 10, a plurality of boost stages 12 (FIGS. 1A and 1B shows two, labeled 12a and 12b) and a load capacitor 14 having capacitance CL. The initial charge transfer switch 10 connects an input Vdd voltage source to the first boost stage 12a. Each boost stage includes a boost capacitor 16 having capacitance Cb and a charge transfer switch 18. Boost capacitors 16 are connected between an input voltage source and a clock voltage source (labeled CLK or CLKb, the complementary signal of the CLK signal). Load capacitor 14 is selectively connected in parallel to the last boost capacitor 16b via the last charge transfer switch 18b. As indicated in FIGS. 1A and 1B, the switches 10, 18a and 18b operate alternatively, in accordance with the state of the clock signal.

Each stage operates in two phases: pre-charge and boost. Pre-charge occurs when the associated clock voltage of a boost capacitor 16 is low, its charge transfer switch is open and that of the previous stage is closed. Thus, in FIG. 1A, boost capacitor 16a is in the pre-charge phase. The initial charge transfer switch 10 is closed and switch 18a is open. As arrow 19 indicates, charge is transferred to boost capacitor 16a.

Boost occurs when the associated clock voltage of a boost capacitor is high, its charge transfer switch is closed and that of the previous stage is open. During boost, charge is transferred to the next stage. In FIG. 1A, boost capacitor 16b is in the boost phase, with charge being transferred to the load capacitor 14, as indicated by the arrow 21. In FIG. 1B, the complementary clock levels reverse the capacitor roles. Thus, boost capacitor 16b is in the boost phase and capacitor 16b is in the pre-charge phase, as indicated by arrow 23.

The opening and closing of switches 10 and 18 occur in accordance with the state of the clock signal CLK which, as shown in FIG. 2, is at a low voltage-from t0 to t1 and at a high voltage from t1 to t2. When the clock signal CLK is at a low voltage, the odd numbered switches (e.g. switches 10 and 18b) are closed and the even numbered switches (e.g. switch 18a) are open, as shown in FIG. 1A. As the clock signal CLK transitions to a high voltage, such as the supply voltage Vdd, the odd numbered switches 10 and 18b open and the even numbered switch 18a closes, as shown in FIG. 1B.

Since the CLK signal is connected to one side of the first boost capacitor 16a and since first boost capacitor 16a has charge thereon in FIG. 1B, the high voltage of the CLK signal forces all of the charge stored in the first boost capacitor 16a to be transferred to the second boost capacitor 16b, as shown by arrow 23. As this cycle repeats, more charge is transferred to the second boost capacitor 16b.

Since the capacitance Cb is fixed, increasing the total charge stored therein requires a corresponding voltage increase across the second boost capacitor 16b. The maximum voltage Vmax that can be achieved is the original value (of the supply voltage) boosted by the supply voltage Vdd. In turn, the second boost capacitor 16b (and n total stages) boosts the maximum voltage to be loaded onto the load capacitor 14 by the supply voltage Vdd. Thus, Vmax= n*Vdd.

Ideal switches do not exist. In one prior art embodiment, diodes are utilized for the switches 10 and 18. This is illustrated in FIGS. 3A and 3B to which reference is now made, where FIG. 3A indicates the state corresponding to that shown in FIG. 1A and FIG. 3B indicates the state corresponding to that shown in FIG. 1B. The charge pump of FIGS. 3A and 3B operates in a similar manner to that of FIGS. 1A and 1B.

The diodes, labeled 20, 22a and 22b, allow charge to flow in only one direction, input to output and, in this manner, operate as switches. However, diodes are far from ideal. Charge transfer occurs only if the diodes are biased with a threshold voltage Vdiode of at least 700 mV. The voltage drops of diodes 20 and 22a limit the maximum amount of charge that can be stored, respectively, in boost capacitors 16a and 16b. As a result, the non-idealities imposed by utilizing diodes as switches reduces the amount of "boost" a charge pump can provide. In fact, the maximum boost voltage Vmax is n*(Vdd-Vdiode).

It is known that MOSFETs (metal oxide semiconductor, field effect transistors) can be configured to simulate diode operation. Thus, as shown in FIGS. 4A and 4B (similar to FIGS. 1A and 1B) to which reference is now made, it is known to make a charge pump with MOSFETs 30, 32a and 32b replacing diodes 20, 22a and 22b, respectively, in what is known as a "diode connection". Each MOSFET has a control gate and two input/output diffusions Diff.

The elements are connected together at nodes 34, 36 and 38, where the initial charge transfer switch (provided by MOSFET 30) is connected to the first stage, labeled 40a, at node 34, the first stage 40a is connected to the second stage, labeled 40b, at node 36, and the second stage 40b is connected to the load capacitor 14 at node 38. In the charge pump of FIG. 4, the gate and the input diffusion Diff of each MOSFET 30 or 32 are connected, in a "diode-connection", to the input of the stage (either the Vdd voltage source for MOSFET 30 or at nodes 34 or 36, for the stages 40a and 40b, respectively) and the output diffusion is connected to the output node (node 36 or 38).

When the CLK signal is low, MOSFET 30 is active, passing a voltage to node 34. At the same time, since load capacitor 14 has some voltage on it which is higher than the voltage at node 34, MOSFET 32a shuts off and thus, should not pass any charge. When the CLK signal transitions from low to high, the even and odd numbered MOSFETs switch activates; MOSFET 30 shuts off and MOSFET 32a turns on. As a result, charge stored in capacitor 16a is transferred to capacitor 16b, as indicated by arrow 23.

However, like diodes, MOSFETs also have a threshold voltage, Vth, which is similar or higher to the Vdiode of diodes. MOSFETs therefore, suffer from the same problem as diodes. In other MOSFET devices, the threshold voltage Vth is almost zero or even negative. These "low-threshold" MOSFET devices should make ideal switches. However, in the diode connection configuration of FIG. 4, the MOSFET device cannot strongly turn off and, as a result, there is a back leakage of charge. Therefore, in the prior art, low threshold voltage MOSFETs are not utilized for charge pumps.

For charge pump applications, where the power supply is substantially larger than either Vdiode or Vth, the charge pump configurations described hereinabove are often efficient enough. However, in applications where Vdd is relatively low, for example in today's low-power applications where Vdd is close to Vdiode or Vth, the effect of switch non-idealities renders these charge-pump configurations impractical.

SUMMARY OF THE PRESENT INVENTION

In accordance with the present invention, the charge transfer switches are formed of charge transfer transistors and single pole, double throw (SPDT) switches each of which controls the gate of its corresponding transistor. Each SPDT switch has two throw contacts, one of which is connected to the left diffusion of its corresponding charge transfer transistor and the other of which is connected to ground. Thus, the SPDT switch selectively connects the gate of the charge transfer transistor it controls between a diode connection (the first contact) and ground (the second contact).

As a result, the charge transfer switches of the present invention are both fully on (when diode-connected) and fully off (when connected to ground), a situation not provided by any of the prior art switching devices. The SPDT switches enable the charge transfer transistors, which can be low or negative threshold MOSFET devices, to operate only in their forward direction. Furthermore, by connecting the gates of the MOSFET devices to ground in the backward direction, the SPDT switches ensure that the MOSFET devices are strongly off and, as a result, there is no back leakage.

The present invention also includes an automatic source finder which is useful for charge transfer transistors formed of p-channel MOSFET devices.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1A:
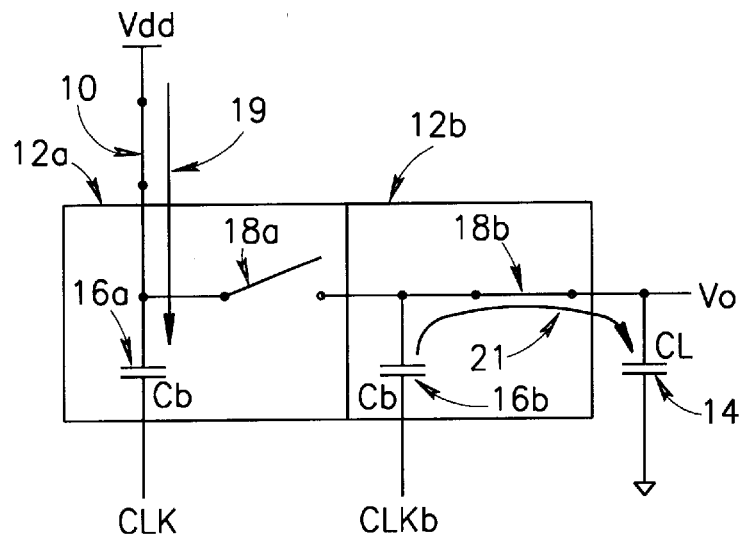
FIGS. 1A and 1B are circuit diagrams showing two states of a prior art ideal charge pump.
Figure 1B:
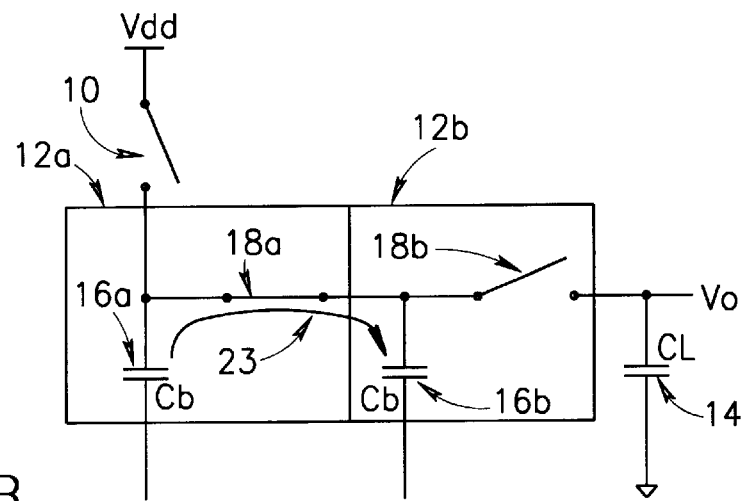
Figure 2:
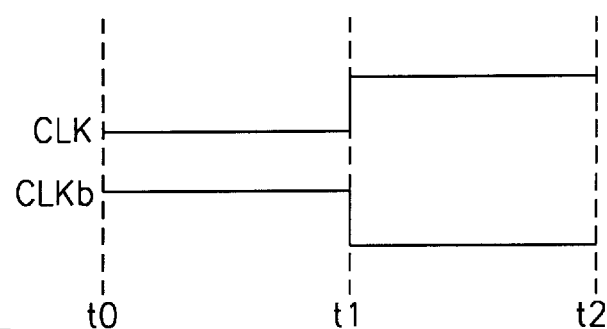
FIG. 2 is a timing diagram for the ideal charge pump of FIGS. 1A and 1B.
Figure 3A:
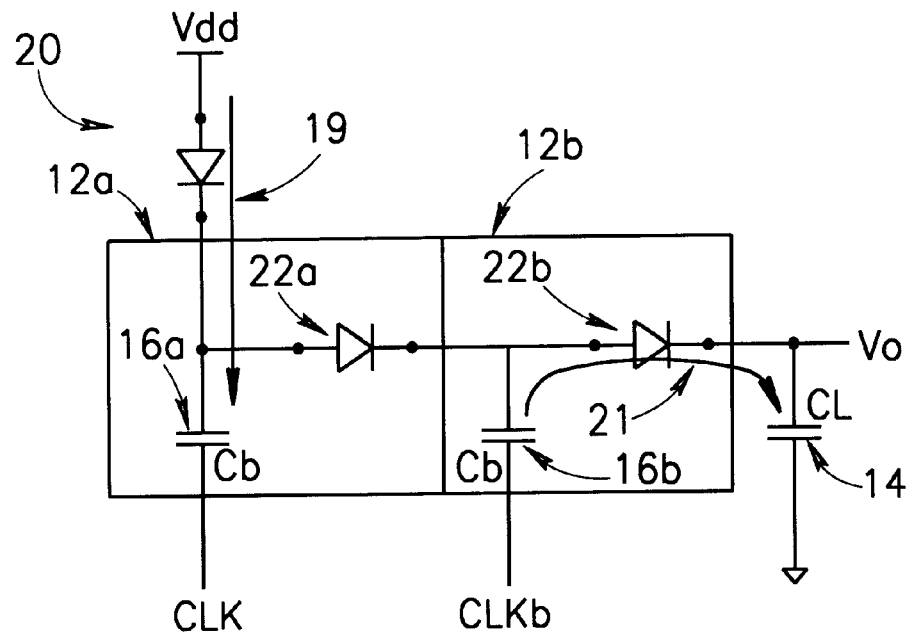
FIGS. 3A and 3B are circuit diagrams showing two states of a prior art charge pump implemented with diodes.
Figure 3B:
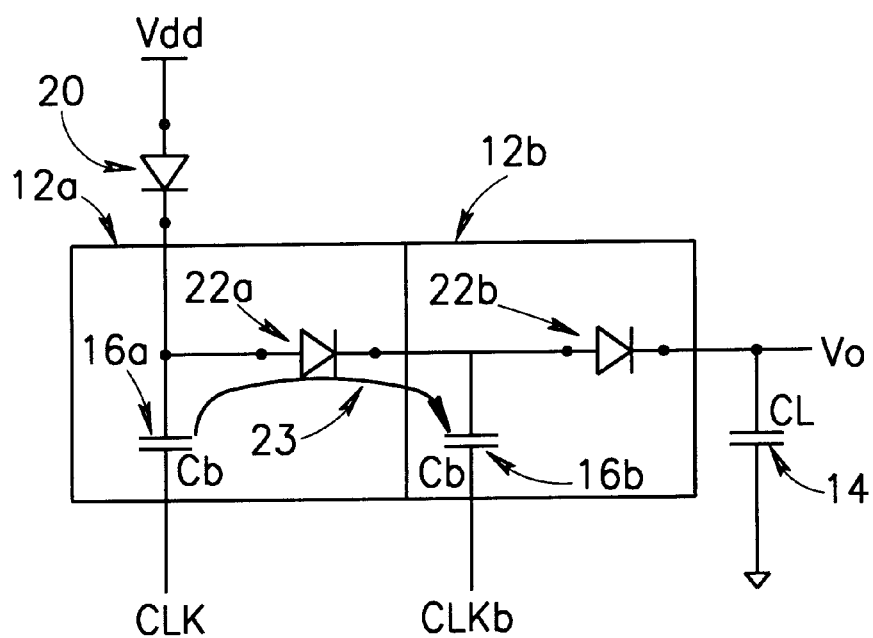
Figure 4A:
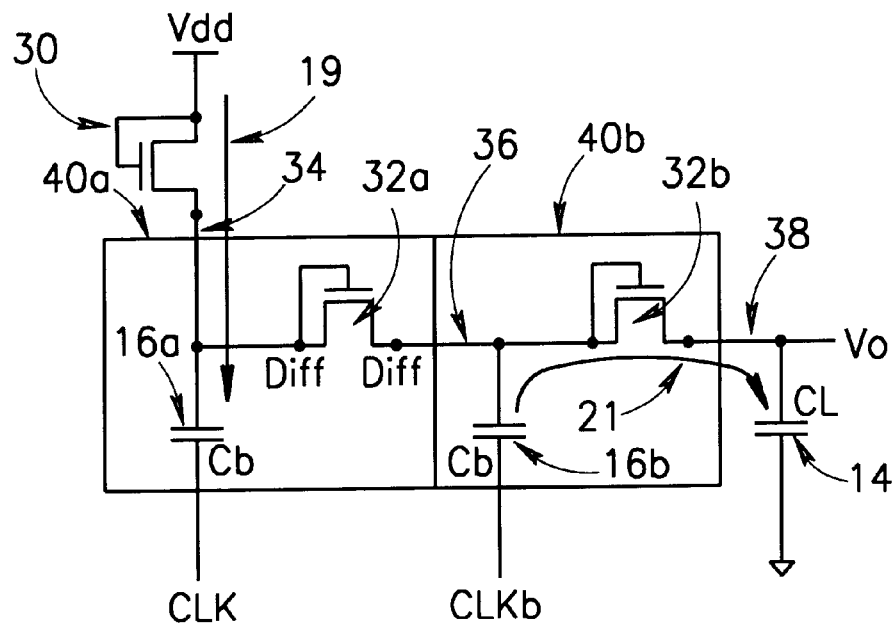
FIGS. 4A and 4B are circuit diagrams showing two states of a prior art charge pump implemented with MOSFET devices.
Figure 4B:
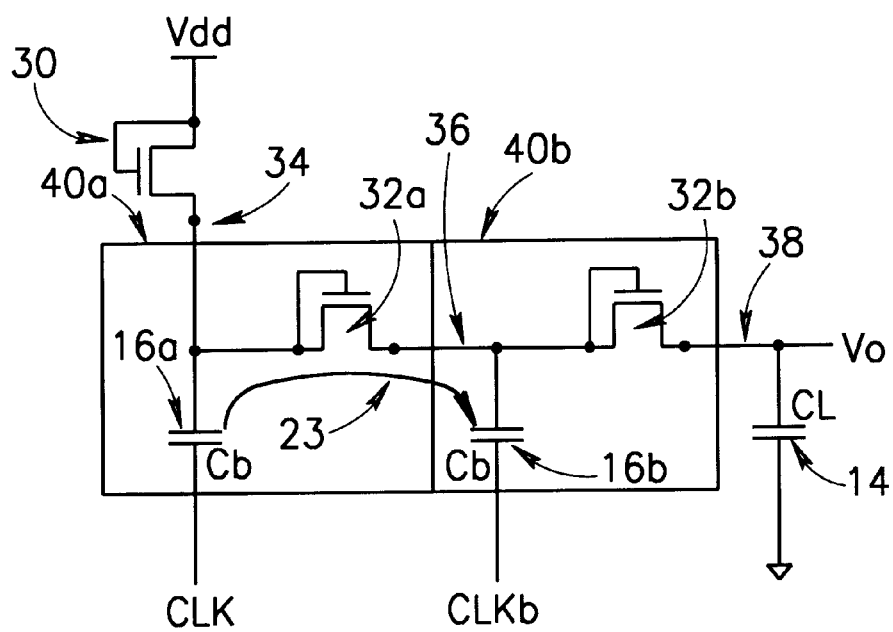
Figure 5A:
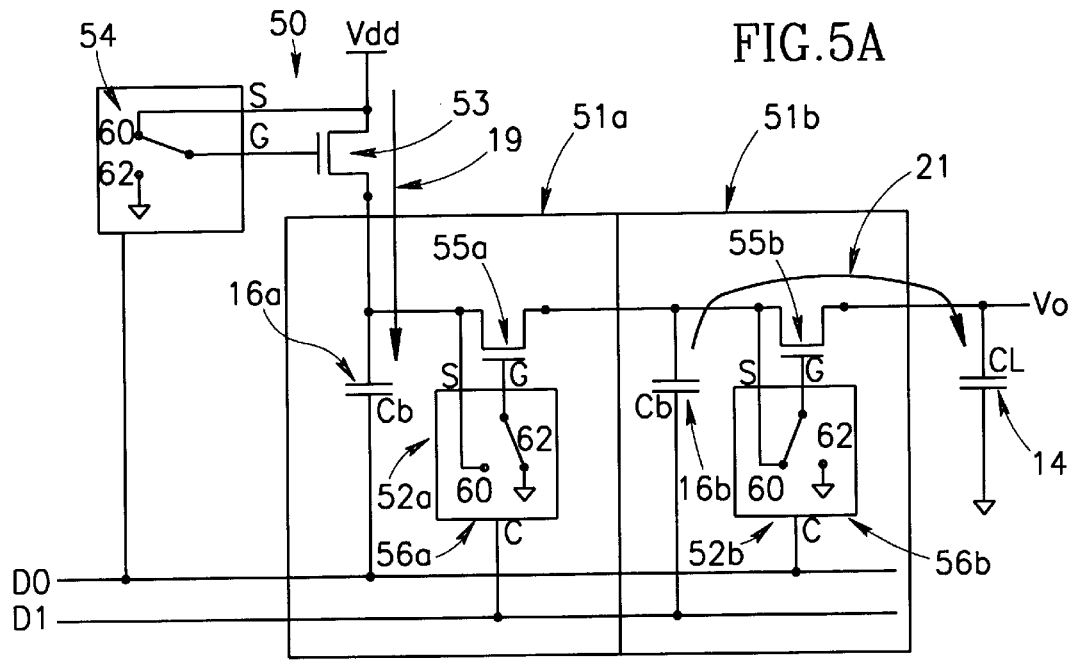
FIGS. 5A and 5B are circuit diagrams showing two states of a MOSFET charge pump with single pole, double throw switch elements connected to the gates of the MOSFET device, constructed and operative in accordance with a preferred embodiment of the present invention.
Figure 5B:
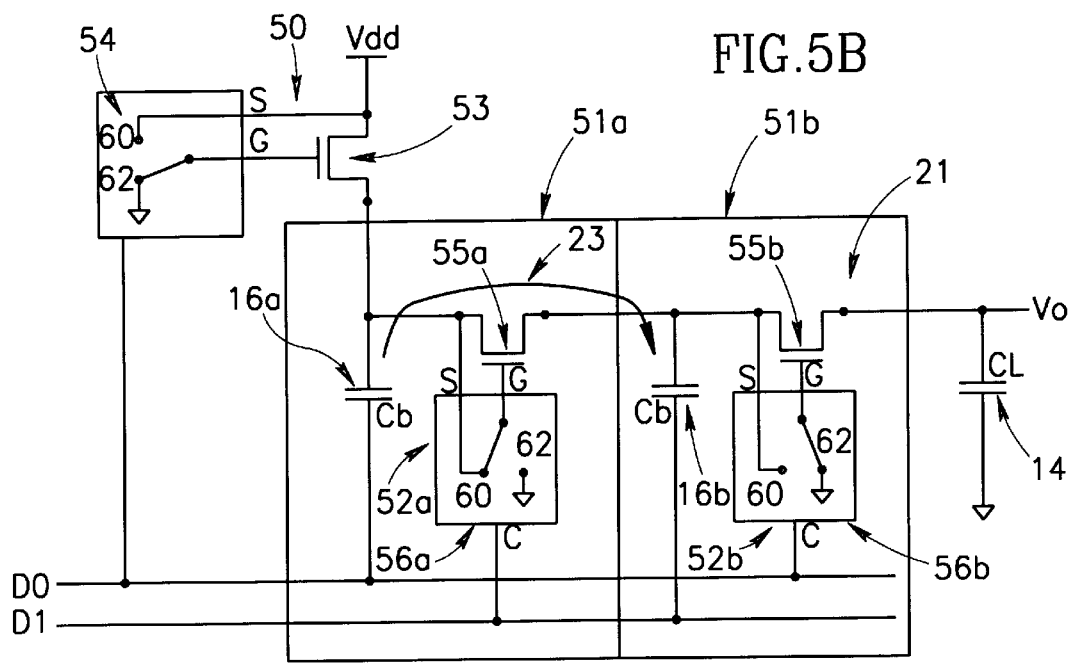
Figure 6:
FIG. 6 is a timing diagram for the charge pump of FIGS. 5A and 5B.

Reference is now made to FIGS. 5A, 5B and 6 which respectively illustrate a MOSFET charge pump (in two phases) and its timing diagram, constructed and operative in accordance with a preferred embodiment of the present invention. Elements which are similar to those of the prior art carry similar reference numerals.

The charge pump of the present invention comprises an initial charge transfer switch 50, a plurality of boost stages 51 (FIGS. 5A and 5B show two, labeled 51a and 51b) and load capacitor 14 having capacitance CL. As in the prior art, the initial charge transfer switch 50 connects the Vdd voltage source to the first boost stage 51a. Each boost stage includes a boost capacitor 16 having capacitance Cb and a charge transfer switch 52. Boost capacitors 16 are connected between an input voltage source and a clock voltage source (labeled D0 or D1). Load capacitor 14 is selectively connected in parallel to the last boost capacitor 16b via the last charge transfer switch 52b. As indicated in FIGS. 5A and 5B, the switches 50, 52a and 52b operate alternatively, in accordance with the state of the clock signals D0 and D1.

In accordance with the present invention, the charge transfer switches 50 and 52 are formed of low-threshold MOSFET devices 53 and 55, respectively, and single pole, double throw (SPDT) switches 54 and 56, respectively. Each SPDT switch 54 or 56 controls the gate of its corresponding MOSFET device 53 or 55 and is, in turn, controlled by clocked control signals D0 and D1. The boost capacitors 16a and 16b are also connected, respectively, to control signals D0 and D1 which respectively control the SPDT switches 56b and 56a.

Each SPDT switch has two throw contacts, labeled 60 and 62. Each contact 60 is connected to the left diffusion of its corresponding MOSFET device and each contact 62 is connected to ground. Thus, the SPDT switch selectively connects the gate of the MOSFET device it controls between a diode connection (contact 60) and ground (contact 62).

As shown in FIG. 6, control signals D0 and D1 operate as opposites; when control signal D0 is at a low voltage, D1 is at a high voltage. Thus, since control signal D0 controls the odd switches and control signal D1 controls the even switches, the two control signals cause the switches to alternately open and close.

When control signal D0 is at the low voltage, the gate G of the odd MOSFET devices 53 and 55b are diode-connected, through poles 60, and thus, MOSFETs 53 and 55b are diode-connected. At the same time, since control signal D0 controls the boost capacitor 16a and since control signal D0 is at the low voltage, boost capacitor 16a charges up and load capacitor 14 receives whatever charge is present on second stage boost capacitor 16b.

Concurrently, control signal D1 is at the high voltage causing the even SPDT switch 56a to connect the gate of its MOSFET device 55a to ground, via its pole 62. By connecting the gate of MOSFET device 55a to ground, MOSFET device 55a is then strongly shut off, thereby inhibiting the back leakage of charge which exists in the prior art. The subsequent stages, and load capacitor 16, are thus disconnected from the first stage 51a.

When control signal D0 transitions to the high voltage, the even SPDT switches 54 and 56b switch the gates G of their corresponding MOSFET devices 53 and 55b to ground, via pole 62, thereby strongly shutting off the MOSFET devices 53 and 55b. At the same time, control signal D1 changes to the low voltage, thereby switching the gate of the second MOSFET device 55b to its left diffusion. MOSFET device 55 is now ON in a diode-connected configuration and charge is transferred from first boost capacitor 16a to second boost capacitor 16b.

It will be appreciated that the charge transfer switches 50 and 52 of the present invention are both fully on and fully off, a situation not provided by any of the prior art switching devices. The SPDT switches 54 and 56 enable the MOSFET devices 53 and 55 to operate only in their forward direction. In this case, since the MOSFET device 53 and 55 are low threshold or even negative threshold devices, the charge transfer switches 50 and 52 are on (i.e. they can transfer all of the charge available). Furthermore, by connecting the gates of the MOSFET devices 53 and 55 to ground in the backward direction, the SPDT switches 54 and 56 ensure that the MOSFET devices 53 and 55 are strongly off and, as a result, that there is no back leakage.

Figure 7:
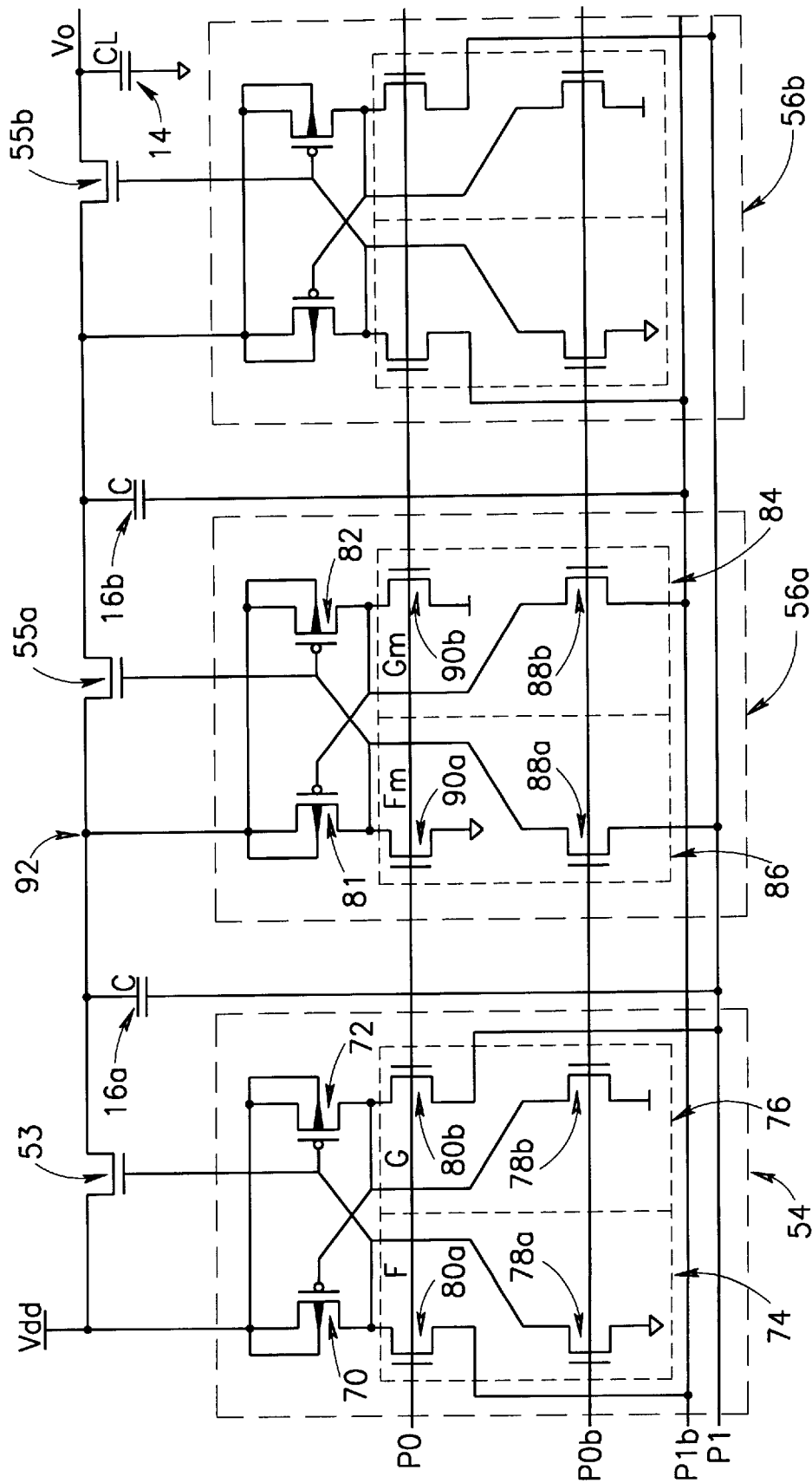
FIG. 7 is a circuit diagram of the charge pump of FIGS. 5A and 5B implemented with differential pass transistor logic.
Figure 8:
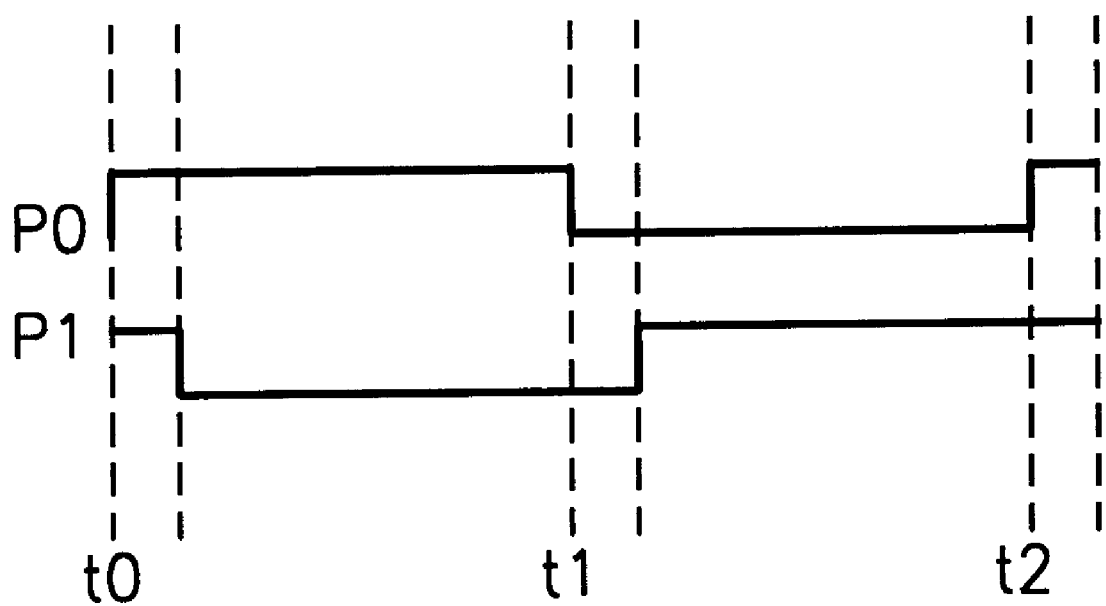
FIG. 8 is a timing diagram for the charge pump of FIG. 7.

Reference is now made to FIGS. 7 and 8 which respectively illustrate one embodiment of the MOSFET charge pump, detailing the SPDT switch construction, and its associated timing diagram. Elements which are similar to those of prior Figures carry similar reference numerals.

In the embodiment of FIG. 7, the SPDT switches 54 and 56 are implemented with differential pass transistor logic (DPTL). The two switches 54 and 56 are formed of similar elements which are connected to different control signals. Therefore, the following discussion will be more detailed for switch 54.

Differential pass transistor logic is described in the following articles.

J. H. Pasternak, et al., "CMOS Differential Pass-Transistor Logic Design", *IEEE Journal of Solid-State Circuits*, Vol. SC-22, No. 2, April 1987, pp. 216–221;

J. H. Pasternak, et al., "Differential Pass-Transistor Logic", *IEEE Journal of Circuits and Devices*, July 1993, pp. 23–28; and J. H. Pasternak, et al., "Design of Submicrometer CMOS Differential Pass-Transistor Logic Circuits", *IEEE Journal of Solid-State Circuits*, Vol. SC-26, No. 9, September 1991, pp. 1249–1258.

SPDT switch 54 comprises left and right voltage translators 70 and 72 and left and right logic elements 74 and 76, respectively. The logic elements 74 and 76 are controlled by control signals P0 and P0b (e.g. the complement of signal P0) and transfer the following signals: GND, Vdd, P1 and P1b.

Each logic element 74 and 76 is comprised of two n-channel transistors 78 and 80, where the transistors 78 are controlled by the P0b signal and transistors 80 are controlled by the P0 signal. When the P0 signal is active, the transistors 80 are active while the transistors 78 are not and, when the P0b signal is active, the opposite is true. The inputs of each transistor 78 and 80 are different; however, the outputs of the transistors 78 and 80 of each logic element are connected together, providing a "wired OR" connection.

In left logic element 74, transistor 78a is connected, on input, to the GND signal and transistor 80a is connected, on input, to the P1b signal. Thus, when signal P0b, which is connected to transistor 78a, is active, transistor 78a will pass the GND signal. Similarly, when signal P0 is active, transistor 80a will pass the P1b signal. The output signal F of left logic element 74 is defined as: P0(P1b)+P0b(GND), which is read as: "When P0 is active, pass P1b or when P0b is active, pass GND."

In right logic element 76, transistor 78b is connected, on input, to the Vdd signal and transistor 80b is connected, on input, to the P1 signal. Thus, the output signal G of right logic element 76 is defined as: P0(P1)+P0b(Vdd).

It will be appreciated that the values of nodes F and G are always complements of each other.

The left and right voltage translators 70 and 72 are each formed of a single p-channel transistor and function to alternately restore signals F and G to the Vdd level and to provide the diode connection during the charge transfer state. In other words, when F is restored to the Vdd level and G is grounded, a diode-connection is established for transfer transistor 53. Alternatively, when G is restored to the Vdd level, F is grounded to effectively turn off transfer transistor 53.

The diffusions of the left voltage translator 70 are connected to the Vdd signal and to the F output line of left logic element 74 and the gate of left voltage translator 70 is connected to the G output line of right logic element 76. The diffusions of the right voltage translator 72 are connected to the Vdd signal and to the G output line and the gate of right voltage translator 72, as well as the gate of MOSFET device 53, is connected to the F output line.

When P0 is active, the F output signal has the value of P1b and the G output signal has the value of P1. FIG. 8, which is a timing diagram for control signals P0 and P1, indicates that the P1 signal is opposite to the P0 and shifted slightly later in time. (The time shift provides the transistors 78 and 80 time to respond to the P0 signal and eliminates any backwash of charge during boost phases). Thus, when P0 is active (e.g. high), the F output signal of P1b is high and the G output signal will carry the P1 signal which is low.

Since the G output signal is low, the left, p-channel, voltage translator 70 is ON, thereby passing the Vdd voltage to the source of translator 70, which is connected to the F output node. Since the F output signal is high (and since the Vdd signal is passed to the F node), and since the F node is connected to the gate of the MOSFET device 53, device 53 is ON. Since the left voltage translator 70 is ON, it forms a diode connection for the low Vth MOSFET device 53. This state is equivalent to being connected to pole 60 of the SPDT switch of FIG. 5A during which charge is passed from the Vdd input line to the boost capacitor 16a. At the same time, the boost capacitor 16a is connected to the P1 signal, which, during the pre-charge phase, is low. Thus, in the pre-charge phase, the boost capacitor 16a can accept charge. It is noted that the right voltage translator 72 is OFF during the pre-charge phase (its gate is connected to the high F output signal).

When P0 becomes logically low (i.e. the boost phase), the G output line becomes logically high (i.e. at voltage Vdd). In this phase, the left p-channel voltage translator 70, which is connected to the G output line, is OFF, thereby disconnecting the Vdd voltage from the F output line.

At the same time, the F output line is logically low (i.e. at voltage GND). Since the F output line is connected to the gate of the MOSFET device 53, the gate is connected to a low voltage (GND). This is equivalent to being connected to pole 62 of the SPDT switch of FIG. 5A. Thus, in this boost phase, the gate of MOSFET device 53 is connected to GND level, effectively disabling any back leakage. At the same time, since the F output line is connected to the gate of the right p-channel voltage translator 72, translator 72 is ON.

Translator 72 thus transfers the Vdd voltage to the G node, further shutting off the left voltage translator 70.

Table 1 provides the state of the various elements of SPDT switch 54 as described hereinabove.

TABLE 1

| State | P0 | P1 | G output line | F output line | Left Voltage translator | Right voltage translator | Gate of MOSFET 53 | Status of MOSFET 53 |
|---|---|---|---|---|---|---|---|---|
| Pre-charge | High | Low | Low | High | Active | inactive | high | Diode-Connected |
| Boost | Low | High | Vdd | GND | Inactive | Active | Low | Off |

The SPDT switch 56a is the dual of SPDT switch 54. Thus, when SPDT switch 54 passes charge, SPDT switch 56a does not, and vice versa.

SPDT switch 56a comprises left and right p-channel voltage translators 81 and 82 and logic elements 84 and 86. Logic elements 84 and 86 are mirror images to logic elements 74 and 76 and produce signals Fm and Gm, which are approximately the complements of signals F and G. The Gm output line of logic element 84 is connected to the left voltage translator 81 and the Fm output line of logic element 86 is connected to the right voltage translator 82.

Logic element 84 is connected to input lines P1b and Vdd and produces the Gm output signal having the function: P0(Vdd)+P0b(P1b). Logic element 86 is connected to input lines P1 and GND and produces the Fm output signal having the function: P0(GND)+P0b(P1).

The gate of the MOSFET device 55a is connected to the gate of the right p-channel voltage translator 82 and to the Fm output line of logic element 86. The source of the left voltage translator 81 is also connected to the Fm output line. The gate of the left voltage translator 81 and the source of the right voltage translator 82 are connected to the Gm output line. The drains of both voltage translators 81 and 82 are connected to the left, input diffusion (labeled node 92) of the second MOSFET device 55a.

When P0 is active, the Fm output signal is low (GND) and the Gm output signal is high (Vdd) which states are opposite to those of F and G, respectively, of SPDT switch 54. The left p-channel voltage translator 81, which is connected to the Gm output line, is OFF, thereby disconnecting the voltage at node 92 from the Fm output line.

Since the Fm output line is connected to the gate of the MOSFET device 55a, the gate is connected to a low voltage. Thus, in this pre-charge phase for capacitor 16a, MOSFET device 55a is strongly shut off and any charge on capacitor 16b can be boosted towards the load capacitor 14.

At the same time, since the Fm output line is connected to the gate of the right p-channel voltage translator 82, translator 82 is ON. Translator 82 thus transfers the voltage of node 92 to the Gm node, further shutting off the left voltage translator 81.

When P0 is not active (during the boost phase of capacitor 16a), the Fm output signal is high (P1) and the Gm output signal is low (P1b). Since the Gm output signal is low, the left, p-channel, voltage translator 81 is ON, thereby passing the voltage of node 92 to the source of translator 81, connected to the Fm output node. Since the Fm output signal is high (because the voltage of node 92 is passed to the Fm node), and since the Fm node is connected to the gate of the MOSFET device 55a, device 55a is ON and diode-connected to node 92. Since P1 is high during the boost phase, capacitor 16a pushes node 92 an additional Vdd potential above its precharge level. At the same time, boost capacitor 16b is connected to the P1b signal, which, during the boost phase of capacitor 16a, is low. Thus, in the boost phase of capacitor 16a, the boost capacitor 16b can accept charge. It is noted that the right voltage translator 82 is OFF during the boost phase (its gate is connected to the high Fm output signal).

Table 2 provides the state of the various elements of SPDT switch 56a as described hereinabove.

TABLE 2

| State | P0 | P1 | Gm output line | Fm output line | Left Voltage translator | Right voltage translator | Gate of MOSFET 55a | Status of MOSFET 55a |
|---|---|---|---|---|---|---|---|---|
| Pre-charge | High | Low | High | Low | Inactive | Active | Low | Off |
| Boost | Low | High | GND | Vdd | Active | Inactive | High | Diode-Connected |

It will be appreciated that the operation and connections of SPDT switch 54 are true for all of the odd switches in the charge pump while the operation and connections of SPDT switch 55a are true for all of the even switches. Thus, FIG. 7 shows SPDT switch 56b exactly as SPDT switch 54. Furthermore, the boost capacitors 16 and load capacitor 14 are alternately connected to the P1 and P1b signals, as shown.

It will be appreciated that the SPDT switches 54 and 56 provide diode connection of the MOSFET devices 53 and 55 when the devices are to be activated and provide connection of the gates of the MOSFET devices 53 and 55 to ground when the devices are to be shut off.

Figure 9:
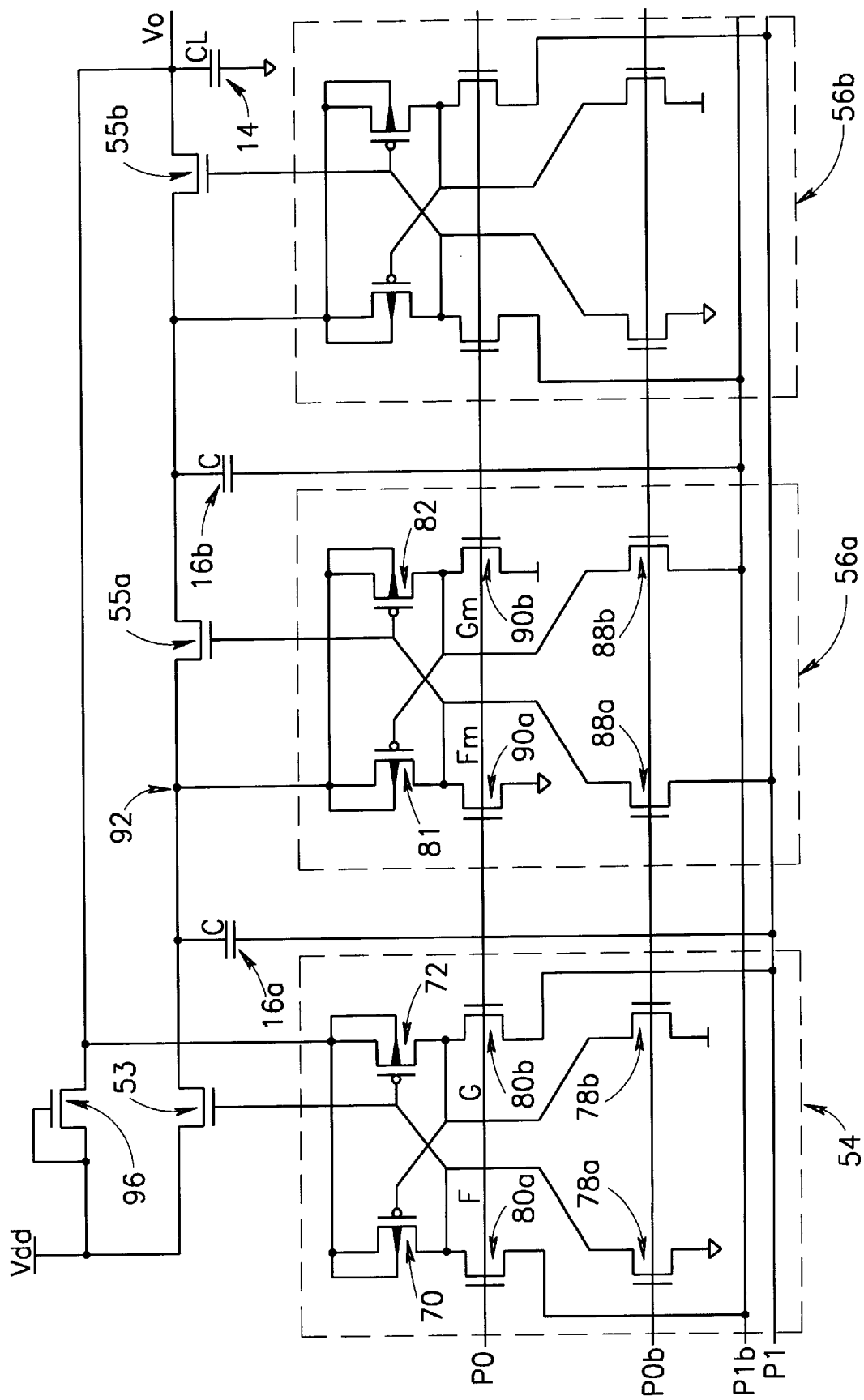
FIG. 9 is a circuit diagram of an alternative embodiment of the charge pump of FIG. 7 providing fast response time.

Reference is now briefly made to FIG. 9 which illustrates an alternative embodiment of the charge pump of FIG. 7 with a faster response time. The charge pump of FIG. 9 operates with the timing diagram of FIG. 8.

The charge pump of FIG. 9 is similar to the charge pump of FIG. 7 and therefore, has similar reference numerals for the similar elements. Thus, it includes the SPDT switches 54, 56a and 56b, the MOSFET devices 53, 55a and 55b, the boost capacitors 16a and 16b and the load capacitor 14. In addition, the charge pump of FIG. 9 includes a further MOSFET device 96 which is diode-connected to the input voltage source Vdd and connected, on output, to the output voltage Vo of the load capacitor 14. Furthermore, the input SPDT switch 54 is connected to the output voltage Vo rather than to the input voltage Vdd. The remaining connections are the same as in the pump of FIG. 7.

Because the first SPDT switch 54 is connected to the output voltage Vo, a level assumed to be larger than Vdd, MOSFET device 53 of FIG. 9 switches on much faster than MOSFET device 53 of the charge pump of FIG. 7. The pre-charge and boost operations of the charge pump of FIG. 9 are the same as those of the pump of FIG. 7 and therefore, will not be described herein.

Figure 10:
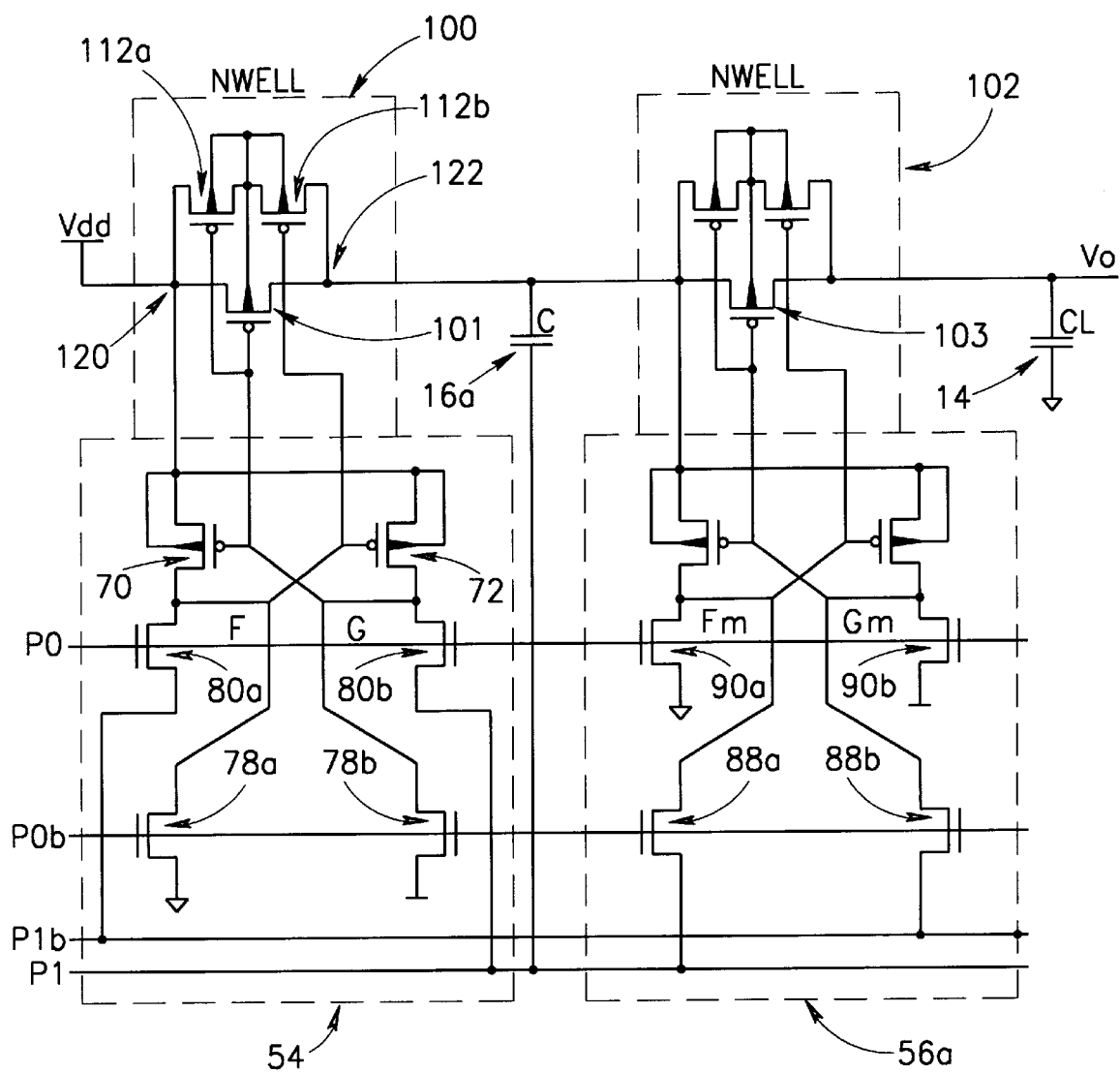
FIG. 10 is a circuit diagram of an alternative embodiment of the charge pump of the present invention having an automatic source finder therein.

Reference is now made to FIG. 10 which illustrates a charge pump having an automatic source finder utilizing the concepts and elements of FIG. 7 and operating with the timing diagram of FIG. 8. The device of FIG. 10 includes the SPDT switches 54 and 56a, the boost capacitor 16a and the load capacitor 14.

In addition, the charge pump of FIG. 10 includes automatic source finders 100 and 102 for p-channel charge transfer MOSFET transistors 101 and 103, respectively. Since the charge transfer transistors 101 and 103 are p-channel, their gates are connected to the opposite output of the SPDT switches 54 and 56 than in the charge pump of FIG. 7. Thus, the gate of charge transfer transistor 101 is connected to the G output signal, rather than to the F output signal, and the gate of charge transfer transistor 103 is connected to the Fm output signal. Otherwise, the operation of the SPDT switches 54 and 56 is the same as that of the previous embodiments and serve to activate and deactivate the p-channel charge transfer transistors 101 and 103. Thus, charge transfer transistor 101 is activated when the G output signal is low which is when the P0 signal is active. This coincides with the P1 signal, which also controls boost capacitor 16a, being low and thus, boost capacitor 16a will be charged when the P0 signal is active. Similarly, load capacitor 14 will be charged when the P0b signal is active and the P1 signal is high.

It is noted that p-channel MOSFET devices require that their n-wells be properly biased. This involves always providing the n-wells with the higher voltage present on the two diffusions of the MOSFET device. The automatic source finder (the "source" is the diffusion with the currently higher voltage) ensures that the n-wells of the charge transfer transistors are always connected to the current source diffusion. The current discussion will focus on automatic source finder 100, the discussion being applicable to all source finders 100 and 102.

Automatic source finder 100 comprises left and right p-channel MOSFET transistors 112a and 112b which are smaller in size than the associated charge transfer MOSFET transistor 101 or 103. The left diffusion of the left p-channel MOSFET transistor 112a is connected to the input diffusion of charge transfer transistor 101 and the right diffusion of the right p-channel MOSFET transistor 112b is connected to the output diffusion of transistor 101 which, in turn, is connected to the boost capacitor 16a. The right diffusion of left MOSFET device 112a and the left diffusion of right MOSFET device 112b are connected together and to the n-wells of the three MOSFET devices 101, 112a and 112b. The gates of the left and right MOSFET transistors 112a and 112b are connected to the G and F signals, respectively.

Initially, the G output signal is low and charge transfer transistor 101 actively transfers charge from the Vdd supply (labeled node 120) to the boost capacitor 16 (labeled node 122). Thus, node 120 is at a higher voltage than node 122. Because the G output signal is low, left p-channel transistor 112a is active and provides the higher voltage of node 120 to bias the n-well. At the same time, right p-channel transistor 112b is inactive.

During the boost stage, boost capacitor 16a provides charge through charge transfer transistor 103. Thus, node 122 is the node with the higher voltage. The F output signal is low which activates right p-channel transistor 112b to provide the voltage of node 122 to the n-wells. At the same time, left p-channel transistor 112a and charge transfer transistor 101 is inactive.

As can be seen, the automatic source finder 100 provides the n-wells with voltage from the currently highest node. Automatic source finder 102 operates similarly to automatic source finder 100 but with opposite polarity.

It will be appreciated that p-channel MOSFET devices have large negative threshold voltages which make them attractive for charge pumps. The present invention incorporates all automatic source finders for charge transfer p-channel MOSFET devices, including any controlled with devices other than DPTL switches such as those shown herein.

It will be appreciated by persons skilled in the art that the present invention is not limited to what has been particularly shown and described hereinabove. Rather the scope of the present invention is defined by the claims which follow:

I claim:

1. A charge pump comprising:
   an initial charge transfer stage having a supply terminal, an initial output terminal and an initial clock terminal;
   a load capacitor;
   a boost section having a boost input terminal connected to said initial output terminal and a boost output terminal connected to said load capacitor; and
   first and second oppositely clocked lines;
   wherein said initial charge transfer stage additionally comprises:
      an initial charge transfer switch, having an initial transfer switch control gate, which conditionally connects said supply terminal to said initial output terminal; and
      an initial gate controller connected to said initial clock terminal and having a transfer state and a non-transfer state wherein, in said transfer state, said initial gate controller applies voltage to said initial transfer switch control gate to transfer charge from the supply terminal to the initial output terminal and in said non-transfer state, disables any charge transfer;
   wherein said boost section comprises at least two boost stages and wherein each boost stage comprises:
      a boost input terminal, a boost output terminal, a boost clock terminal and a boost capacitor terminal;
      a boost capacitor connected between said boost input terminal and said boost capacitor terminal;
      a boost charge transfer switch, having a boost transfer switch control gate, which conditionally connects said boost input terminal to said boost output terminal;
      a boost gate controller connected to said boost clock terminal and having a transfer state and a non-transfer state wherein, in said transfer state, said boost gate controller applies voltage to said boost transfer switch control gate to transfer charge from said boost input terminal to the boost output terminal and in said non-transfer state, disables any charge transfer;

wherein said first control line is connected to said initial clock terminal, to the boost capacitor terminals of odd numbered boost stages and to the boost clock terminals of even numbered boost stages; and wherein said second control line is connected to the boost capacitor terminals of even numbered boost stages and to the boost clock terminals of odd numbered boost stages.

2. A charge pump according to claim 1 and wherein the gate controller of each of the boost and initial stages comprises:

a voltage translator; and a logic element, wherein, within each stage, said voltage translator is connected to the charge transfer switch and the input terminal of the stage and to the logic element of said gate controller and switchably provides a diode-connected configuration between the charge transfer switch and the input terminal in response to switching signals from said logic element, and wherein said logic element is connected to said voltage translator, to a ground terminal and to the clock terminal of said gate controller and provides low voltage switching signals to said voltage translator to switch between said diode-connected configuration and a connection to a ground terminal via said logic element.

3. A charge pump according to claim 2 wherein said voltage translator comprises first and second p-channel transistors connected in parallel between the input terminal and the logic element of the gate controller, wherein a first output line of said logic element is connected to a gate of said first p-channel transistor and a drain of said second p-channel transistor and a second output line of said logic element is connected to a gate of said second p-channel transistor, to a gate of the charge transfer switch of said gate controller and a drain of said first p-channel transistor.

4. A charge pump according to claim 3 and wherein there are even and odd numbered logic elements corresponding to said odd and even numbered boost stages, wherein said initial charge transfer stage comprises an odd numbered logic element, wherein each said odd logic element comprises first, second, third and fourth n-channel transistors and said even numbered logic element comprises fifth, sixth, seventh and eighth n-channel transistors, wherein, for each said odd numbered logic element:

said first transistor is connected between said second output line and said second control line and is controlled by a third control line having a signal thereon which is oppositely clocked vis-a-vis said first control line;

said second transistor is connected between said second output line and said ground terminal and is controlled by a fourth control line which is the complement of said third control line;

said third transistor is connected between said first output line and said first control line and is controlled by said third control line;

said fourth transistor is connected between said first output line and a power supply node and is controlled by said fourth control line, wherein, for said even numbered logic element:

said fifth transistor is connected between said second output line and said ground terminal and is controlled by said third control line;

said sixth transistor is connected between said second output line and said first control line and is controlled by said fourth control line;

said seventh transistor is connected between said first output line and said power supply node and is controlled by said third control line; and said eighth transistor is connected between said first output line and said second control line and is controlled by said fourth control line.

5. A charge pump according to claim 2 and also comprising a diode-connected transistor connected between said supply terminal and said load capacitor, wherein the voltage translator of the initial transfer stage is connected to the load capacitor instead of the initial input terminal.

6. A charge pump according to claim 1 and wherein said charge transfer switches are one of the following type of transistor: natural n-channel transistors, depletion n-channel transistors or transistors with zero threshold voltage.

7. A charge pump according to claim 1 wherein the charge transfer switches are p-channel MOSFET transistors and wherein the charge pump also comprises one automatic source finder for each charge transfer switch.

8. A charge pump according to claim 7 and wherein the gate controller of each stage comprises:

a voltage translator, and a logic element, wherein, within each of the stages, said voltage translator is connected to the charge transfer switch and the input terminal of the stage and to the logic element of said gate controller and switchably provides a transfer connection between the charge transfer switch, the input terminal and the output terminal of the stage in response to switching signals from said logic element, and wherein said logic element is connected to said voltage translator, to a ground terminal and to the clock terminal of said gate controller and provides low voltage switching signals to said voltage translator to switch between said transfer connection and a connection to a ground terminal via said logic element.

9. A charge pump according to claim 8 wherein said voltage translator comprises first and second p-channel transistors connected in parallel between the input terminal and the logic element of the gate controller, wherein a first output line of said logic element is connected to a gate of said first p-channel transistor and a drain of said second p-channel transistor and a second output line of said logic element is connected to a gate of said second p-channel transistor, to a gate of the charge transfer switch of said gate controller and a drain of said first p-channel transistor.

10. A charge pump according to claim 9 and wherein each automatic source finder comprises left and right p-channel transistors connected in series with each other and in parallel to the corresponding said p-channel charge transfer transistor and wherein the n-wells of said left, right and charge transfer p-channel transistors are connected together and to the series connection point of said left and right p-channel transistors, wherein the first output line controls said left p-channel transistor and said second output line controls said right p-channel transistor.

11. A charge pump according to claim 9 and wherein there are even and odd numbered logic elements corresponding to said odd and even numbered boost stages, wherein said initial charge transfer stage comprises an odd numbered logic element, wherein each said odd logic element comprises first, second, third and fourth n-channel transistors and said even numbered logic element comprises fifth, sixth, seventh and eighth n-channel transistors, wherein, for each said odd numbered logic element:

said first transistor is connected between said second output line and said second control line and is controlled by a third control line having a signal thereon which is oppositely clocked vis-a-vis said first control line;

said second transistor is connected between said second output line and said ground terminal and is controlled by a fourth control line which is the complement of said third control line;

said third transistor is connected between said first output line and said first control line and is controlled by said third control line; and said fourth transistor is connected between said first output line and a power supply node and is controlled by said fourth control line, wherein, for said even numbered logic element:

said fifth transistor is connected between said second output line and said ground terminal and is controlled by said third control line;

said sixth transistor is connected between said second output line and said first control line and is controlled by said fourth control line;

said seventh transistor is connected between said first output line and said power supply node and is controlled by said third control line; and said eighth transistor is connected between said first output line and said second control line and is controlled by said fourth control line.

* * * * *